United States Patent [19]

Nakamura

[11] Patent Number: 5,367,189
[45] Date of Patent: Nov. 22, 1994

[54] VERTICAL SEMICONDUCTOR DEVICE

[75] Inventor: Shunji Nakamura, Yokohama, Japan

[73] Assignee: Fujitsu Limited, Kawasaki, Japan

[21] Appl. No.: 971,235

[22] Filed: Nov. 4, 1992

Related U.S. Application Data

[62] Division of Ser. No. 729,239, Jul. 12, 1991, Pat. No. 5,202,273.

[30] Foreign Application Priority Data

Jul. 12, 1990 [JP] Japan .................. 2-186203

[51] Int. Cl.$^5$ ............... H01L 23/48; H01L 27/00; H01L 29/40; H01L 49/02
[52] U.S. Cl. ...................... 257/508; 257/39; 257/135; 257/136; 257/263; 257/328; 257/347; 257/352; 257/505; 257/507; 257/510; 257/520; 257/573; 257/587; 257/661; 257/663; 257/781
[58] Field of Search ............... 257/508, 510, 513, 517, 257/518, 520, 526, 507, 505, 39, 135, 136, 263, 328, 347, 352, 573, 587, 661, 663, 781

[56] References Cited

U.S. PATENT DOCUMENTS

| | | | |
|---|---|---|---|
| 3,579,058 | 5/1971 | Armgarth | 257/526 |
| 4,870,475 | 9/1989 | Endo et al. | 257/508 |

FOREIGN PATENT DOCUMENTS 1151263 6/1989 Japan.

*Primary Examiner*—Andrew J. James
*Assistant Examiner*—Alice W. Tang
*Attorney, Agent, or Firm*—Staas & Halsey

[57] ABSTRACT

A semiconductor device comprises a first electrode buried in one main face of a substrate and surrounded by a first insulator, a field oxide film covering the surface of the first electrode, a semiconductor layer connected with the first electrode, a second insulator covering the surface of the semiconductor layer, a second electrode connected with the semiconductor layer, a gate electrode connected with the semiconductor layer between the second insulator and the field oxide film, and an outgoing electrode connected with the first electrode.

30 Claims, 9 Drawing Sheets

DRIFTING SPEED OF SiC ELECTRONS

VERTICAL SEMICONDUCTOR DEVICE

BACKGROUND OF THE INVENTION

This application is a division of application No. 07/729,239, filed Jul. 12, 1991, now U.S. Pat. No. 5,202,273, 1. Field of the Invention The present invention relates to semiconductor devices and a method of manufacturing the same, and particularly, to high-speed vertical MOS transistors, SITs and 3-terminal superconducting transistors, and methods of manufacturing same.

2. Description of the Related Art

As the demand for high-speed information processing increases, high-speed integrated circuits and transistors for constituting such circuits are needed. This inventor proposed such high-speed semiconductor integrated circuits in Japanese Unexamined Patent Publication Nos. 1-151263 and 1-15126.

FIG. 1 shows one of the high-speed semiconductor devices proposed by the inventor. This semiconductor device involves a static induction transistor (SIT), i.e., a vertical-type (with active carriers flowing orthogonally to a substrate) JFET (junction field effect transistor).

In FIG. 1, numeral 21 denotes a p-type silicon (p-Si) semiconductor substrate, 22 a high-concentration n-type (n+-type) drain region, 23 a silicon dioxide ($SiO_2$) field insulation film, 24 an n-type silicon (n-Si) semiconductor layer, the periphery of which in contact with a gate electrode is p-type, 25 an $SiO_2$ interlayer insulation film, 26 a gate electrode, 27 a source electrode, and 28 a drain electrode.

The gate length of this transistor can be precisely defined by controlling the thickness of the semiconductor layer 24, and therefore, it is possible to minimize a parasitic capacitance of the gate and improve the speed of the transistor.

This transistor, however, has the following problems if a further improvement of the operation speed is required:

(1) A junction capacitance between the drain region 22 and the semiconductor substrate 21 hinders the high-speed operation. It is preferable, therefore, to provide an SOI (silicon on insulator) structure with an insulator substrate.

(2) When forming the field $SiO_2$ film 23 on the silicon substrate, the $SiO_2$ film swells as shown in FIG. 2 and prevents the formation of a gate opening, thereby preventing a normal operation of the transistor. Namely, in FIG. 2, when the field $SiO_2$ film 23 is formed with an oxidation-resistant silicon-nitride ($Si_3N_4$) insulation film as a mask, an $SiO_2$ projection 23A is formed between the field $SiO_2$ film 23 and the semiconductor layer 24. This projection 23A causes the hindrance mentioned above.

(3) To improve the operation speed, the drain region 22 must have as low a resistance as possible. It is preferable, therefore, to form the drain region 22 with metal. This cannot be realized according to the conventional technique.

The structure of FIG. 1 is not applicable for a 3-terminal superconducting transistor, because not only the source electrode but also the semiconductor substrate, serving as a drain electrode of the superconducting transistor, must be made of superconducting materials, and the conventional technique is unable to achieve this.

SUMMARY OF THE INVENTION

To solve these problems, an object of the invention is to provide a high-speed vertical semiconductor device and a method of manufacturing the same.

To accomplish this object, the invention provides a semiconductor device basically comprising a first electrode buried in one main face of a substrate and surrounded by a first insulator, a field oxide film covering the surface of the first electrode, a semiconductor layer connected with the first electrode through an opening formed though the field oxide film, a second insulator covering the surface of the semiconductor layer, a second electrode connected with the semiconductor layer though an opening formed through the second insulator, a gate electrode connected with the semiconductor layer between the second insulator and the field oxide film, and an output electrode connected with the first electrode though another opening formed through the field oxide film.

According to the invention, this semiconductor device is fabricated by:

a first process of forming, on a temporary substrate, a semiconductor layer of first conduction type having a smaller etching rate than that of the temporary substrate under the same etching condition and a first insulation film, and opening a contact hole in the first insulation film to expose the semiconductor layer;

a second process of forming a first electrode on the first insulation film over the contact hole such that the first electrode connects with the semiconductor layer;

a third process of indirectly adhering a reinforcing material to the temporary substrate through an insulator, or directly adhering a reinforcing insulation material to the temporary substrate, and etching and removing the temporary substrate with use of the reinforcing material as a support substrate;

a fourth process of forming a protruding pattern of the semiconductor layer and a second insulation film laminated one upon another on the support substrate, and forming a gate insulation film on the side face of the semiconductor layer; and a fifth process of forming a gate electrode on the side face of the semiconductor layer, opening the second insulation film and forming a second electrode on the semiconductor layer, and opening the first insulation film and forming an output electrode on the first electrode.

Through these techniques, the invention provides a high-speed vertical semiconductor device having an SOI structure. The abnormality occurring at a gate opening portion on the side face of a semiconductor layer of the conventional high-speed vertical structure never occurs in the arrangement of the invention because the invention has no field insulation film. Also, the invention minimizes the length of a p-n junction to suppress parasitic capacitance to a value as small as possible. Since the invention allows the source and drain electrodes of a semiconductor device to be formed with metal or a superconducting material, the invention contributes to improving the speed of operation of the semiconductor device

DESCRIPTION OF THE PREFERRED EMBODIMENTS

Embodiments of a semiconductor device according to the invention will be explained in detail with reference to the drawings.

Figure 1:
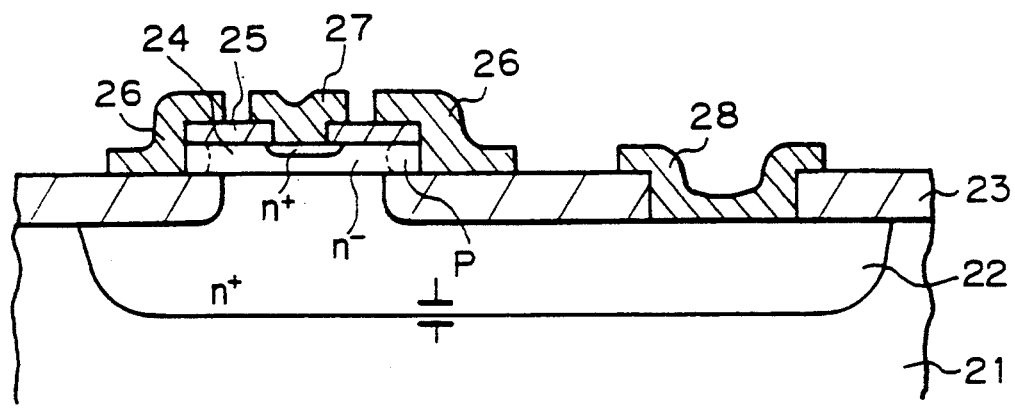
FIG. 1 is a sectional view showing a conventional high-speed transistors.
Figure 2:
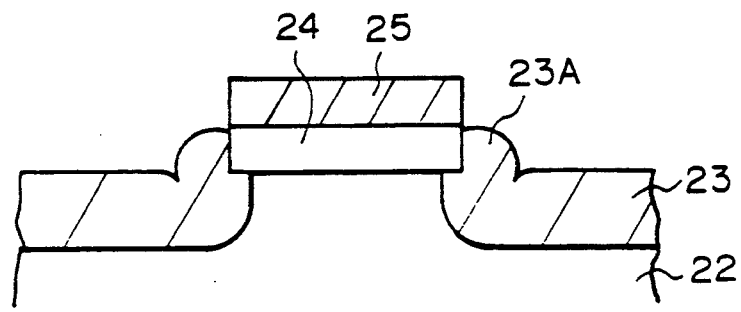
FIG. 2 is a sectional view showing the problem of the conventional semiconductor device after forming a field insulation film.
Figure 3A:
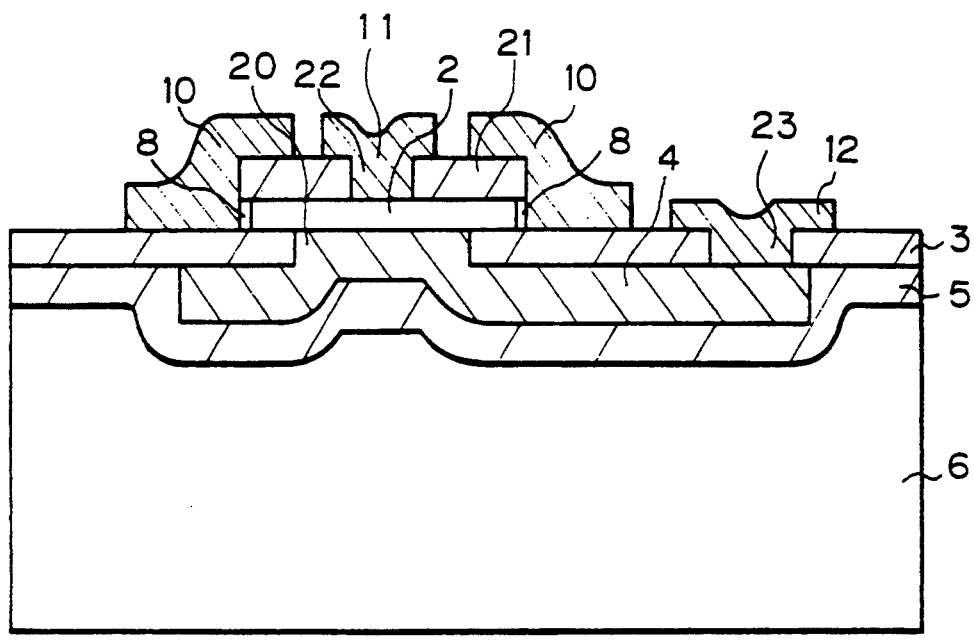
FIGS. 3A and 3B are sectional views of first and second embodiments of semiconductor devices according to the invention.

FIG. 3A shows the basic arrangement of a semiconductor device according to the invention. This semiconductor device comprises a first electrode 4 buried in one main face of a substrate 6 and surrounded by a first insulator 5, a field oxide film 3[for] covering the surface of the first electrode 4, a semiconductor layer 2 connected with the first electrode 4 through an opening 20 formed in the field oxide film 3, a second insulator 21 covering the surface of the semiconductor layer 2, a second electrode 11 connected with the semiconductor layer 2 through an opening 22 formed in the second insulator 21, a gate electrode 10 connected with the semiconductor layer 2 between the second insulator 21 and the field oxide film 3, and an output electrode 12 connected with the first electrode 4 though another opening 23 formed on the field oxide film 3. This arrangement is applicable for a high-speed vertical MOS transistor, a SIT, or a 3-terminal superconducting transistor.

The substrate 6 is not particularly limited as to material, but preferably is selected from semiconductor, insulation material, and glass materials.

One of the features of the invention is that the first electrode 4 which is buried in the substrate 6 is completely isolated from peripheral devices by the insulator 5. Namely, when the substrate 6 is made of semiconductor, glass, etc., the first electrode 4 is surrounded by the insulator 5 as shown in FIG. 3A. If the substrate 6 itself is made of insulation material, the insulator 5 of FIG. 3A is not required.

This first electrode 4 is preferably made of a conductive material having a low resistance and high withstanding voltage. For example, the first electrode 4 is selected from a refractory metal, an eutectic alloy of metal and semiconductor, such as silicide, a superconducting material, and a semiconductor material.

In consideration of high integration and efficiency, it is preferable to use a material which allows the first electrode 4 to be fabricated without using a burying technique.

The semiconductor material to be used for the first electrode 4 is preferably polycrystalline silicon having a high heat resistance and high diffusion coefficient thereby to easily diffuse impurities.

The superconducting material to be used for the first electrode 4 may be niobium, or niobium/germanium.

The surface of the first electrode 4 is covered with the field oxide film 3 such as an $SiO_2$ film. The opening 20 is formed though the field oxide film 3, and through which the first electrode 4 is in contact with the semiconductor layer 2.

The semiconductor layer 2 may be of monocrystalline material, such as monocrystalline silicon, or more preferably, silicon carbide (SiC). It is also possible to make the semiconductor layer 2 from a diamond thin film, or a boron nitride monocrystalline material. The semiconductor layer 2 must be chemically stable, serve as a mask, and have a high withstand voltage, as will be explained later in the description of a method of producing a semiconductor device.

The reason why the silicon carbine (SiC) is particularly preferable for the semiconductor layer 2 will be explained.

The band gap (Eg) of SiC is larger than that of Si, so that SiC is advantageous in terms of high-temperature operation. The band gap (Eg) of Si is about 1.1 eV, while that of SiC is about 2.2 eV, which is about two times as large as that of Si.

The maximum operation temperature of an Si device is about 200 degrees Centigrade, while an SiC device can operate at least 400 degrees Centigrade. Namely, the SiC device is resistant to severe environments, such as high temperature. The breakdown electrode field strength (EBD) of Si is about $2 \times 10^5$ V/cm, while that of SiC is about $3 \times 10^6$ V/cm, which is about one digit (i.e., an order of magnitude) larger than that of Si. Namely, SiC can form a device having a high withstand voltage.

Figure 9:
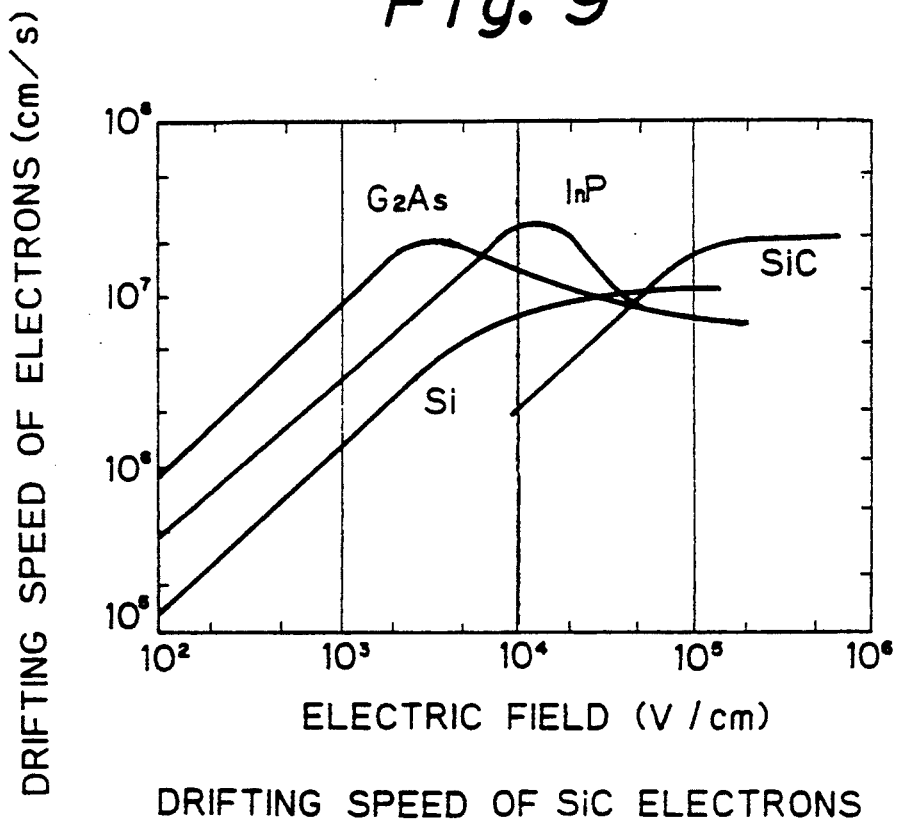
FIG. 9 is a diagram showing electron drifting speeds in silicon carbide (SiC)

As shown in FIG. 9, the electron drifting speed of Si is faster than that of SiC on the low electric field side. On the high electric field side, however, SiC is faster than Si. Generally, in a semiconductor integrated circuit, integrated fine elements do not mean a reduced voltage but an increased internal electric field strength. This is the reason why SiC is more advantageous than Si, for use in improving the operation speed of conventional high-speed devices. In addition, as shown in FIG. 9, SiC is more preferable in the high electric field region than so-called high speed semiconductor materials such as GaAs and InP.

Preferably, the first electrode 4 is made of polycrystalline silicon, and the semiconductor layer 2 is made of monocrystalline silicon such as SiC.

To improve the operation speed, the semiconductor Layer 2 must be as thin as possible.

Figure 3B:
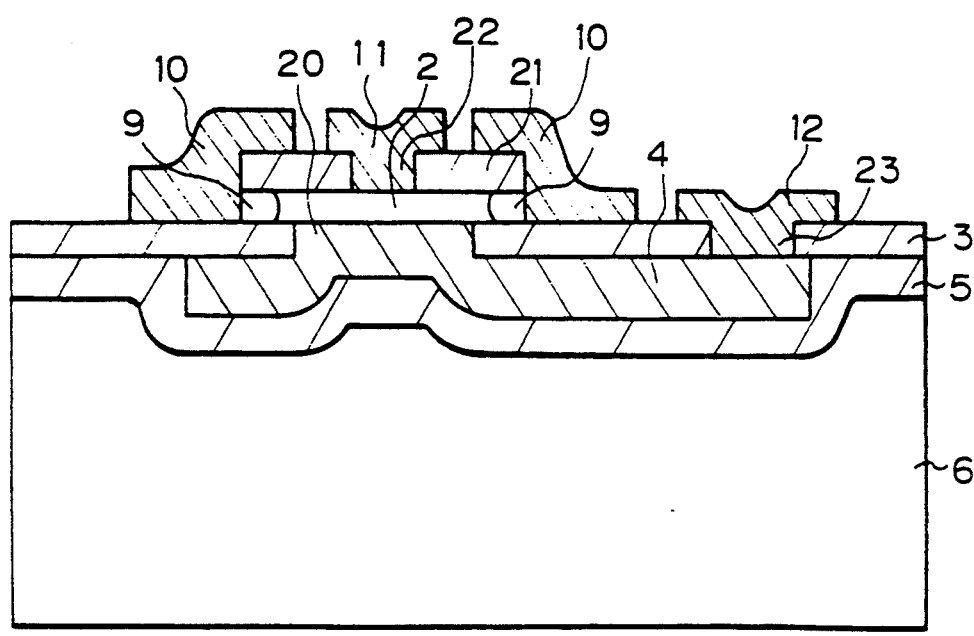

Each end (i.e., each end wall surface) of the semiconductor layer 2 is covered with a gate insulation film 8, and through which the semiconductor layer 2 is coupled to the gate electrode 10. Instead of the gate insulating film 8, each end of the semiconductor layer 2 may have a diffusion region 9 in which impurities having a conduction (i.e., conductivity) type different from that of the semiconductor layer 2 are diffused, as shown in FIG. 3B. In this case, the semiconductor layer 2 is coupled to the gate electrode 10 through the diffusion region 9.

The surface of the semiconductor layer 2 is covered with the second insulator 21 made of an oxide film such as an $SiO_2$ film, or of a nitride film such as $SiN_4$. At a proper position on the second insulator 21, there is formed the opening 22 through which the second electrode 11 is in contact with the semiconductor layer 2. The second electrode 11 may be made of any material including superconducting material.

In forming the second insulator 21 on the semiconductor layer 2, each end wall surface of the semiconductor layer 2 must be exposed, between the second insulator 21 and the field insulation film 3, so that the semiconductor layer 2 is coupled to the gate electrode 10.

The opening 23 is formed at a proper position, different from the position of the opening 20, on the field insulation film 3. The output electrode 12 is formed in the opening 23 and so as to be in contact with the first electrode 4.

A method of producing such a semiconductor device according to the invention will be explained with reference to FIGS. 8A to 8E.

Figure 8A:
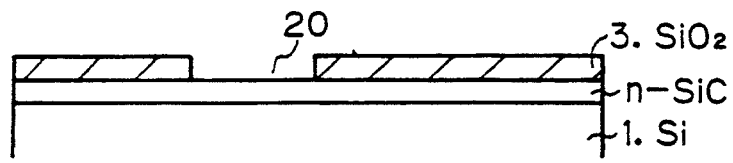
FIGS. 8A to 8E are sectional views of respective structures produced in successive steps of a method of producing a semiconductor device according to the invention.

In FIG. 8A, a temporary Si substrate 1 is used to epitaxially grow thereon an n-type silicon carbide (n-SiC) semiconductor layer 2 of 100 to 1000 Angstroms in thickness. The semiconductor layer 2 is selected to have a smaller etching rate than the temporary substrate 1, under a certain etching condition.

To epitaxially grow the semiconductor layer 2, there are used $SiCl_3$ as a source gas for Si, $C_3H_8$ as a source gas for C, $B_2H_6$ as dopant gas, and $H_2$ as a carrier gas. These gases are used in an atmosphere having a reduced pressure of 200 Pa, and at a substrate temperature of 1000 degrees Centigrade.

An $SiO_2$ film 3 of 2000 to 3000 Angstroms in thickness is grown as the second insulation film 3 on the semiconductor layer 2 by a vapor deposition (CVD) method, and a contact region (or hole) 20 is opened according to a normal lithography technique.

Figure 8B:
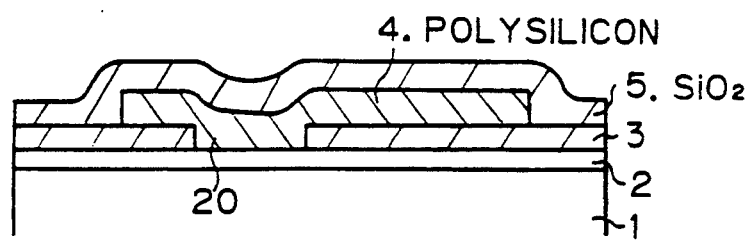

In FIG. 8B, a doped polysilicon film 4 is grown to a thickness of about 3000 Angstroms. Instead of the polysilicon, refractory metals, high-temperature superconducting oxides, etc., may be used as electrode material, as mentioned before.

The polysilicon film 4 is patterned to form the first electrode 4.

An $SiO_2$ film 5 of about 3000 Angstroms in thickness is formed over the temporary substrate 1 according to the CVD method. This insulation film 5 is defined as the first insulator 5 according to the invention. This first insulator (i.e., insulation film) 5 is not needed if a reinforcing material or a support substrate, to be formed later, is made of an insulation material.

Figure 8C:
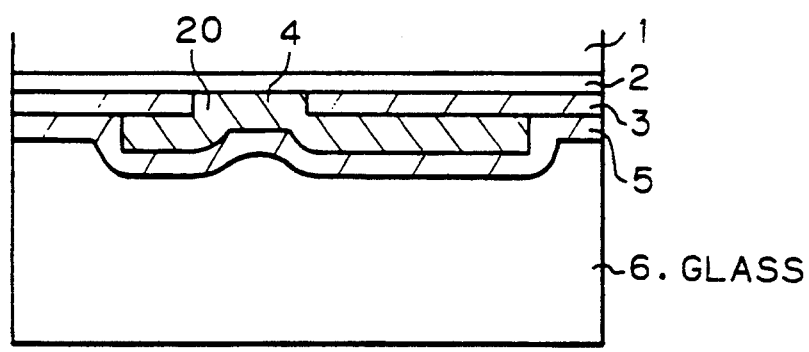

In FIG. 8C, the structure of FIG. 8B is inverted and a glass plate having a melting point of about 600 to 1000 degrees Centigrade is melted and adhered as a reinforcing material 6 the surface of the first insulating layer 5.

In forming the reinforcing material 6, the surface of the temporary substrate 1 may be flattened with use of a flattening insulation film, etc., and another Si substrate may be adhered as the reinforcing material 6. Alternatively, the reinforcing material 6 may be made of organic material such as resin or inorganic material. In this case, the material to be selected must withstand a heat treatment to be carried out later, or the temperature of the heat treatment must be lowered so that the material may withstand the heat treatment.

The temporary Si substrate 1 is etched with fluoronitrate and removed to expose the semiconductor layer 2. In this case, if the semiconductor layer 2 is made of SiC, it is substantially not etched. Also, the reinforcing material 6 must not be etched. If the reinforcing material 6 is made of glass, it may be masked with organic material such as a resist, and after the etching, the organic material is removed.

Thereafter, the semiconductor device as a whole is turned upside down as shown in FIG. 8C, and the reinforcing material 6 is used as a support substrate in processes that follow.

Through the above processes, the surface of the support substrate 6 becomes completely flat in spite of the buried first electrode 4. This contributes to improved accuracy in the later processes.

Figure 8D:
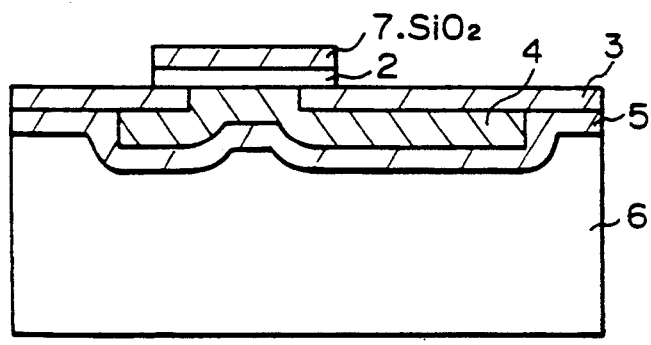

In FIG. 8D, an $SiO_2$ film 7 (21) of about 2000 Angstroms in thickness is formed as the second insulation film 7 (21) on the surface of the support substrate by a low-temperature plasma CVD method at 400 degrees Centigrade. The $SiO_2$ film 7 and SiC layer 2 are etched, with use of a resist mask (not shown) formed on a contact region and anisotropic etching, to form a protruding pattern. Each side of the semiconductor layer 2 is opened for a gate electrode. A reactive gas used for this etching is $CF_4$ or $Cl_2+BCl_3$.

Figure 8E:
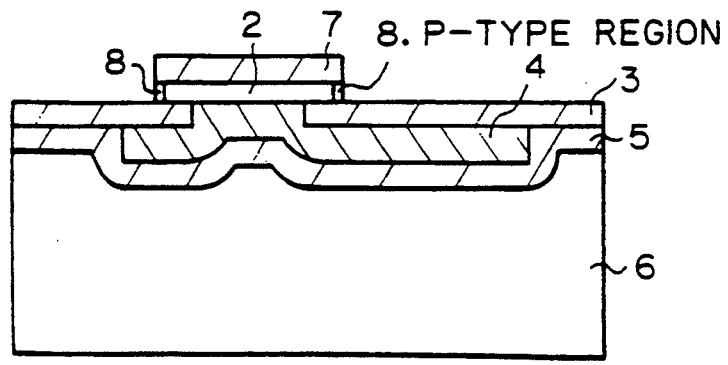

In FIG. 8E, an $SiO_2$ film 8 of 200 Angstroms in thickness is formed on each side wall of the SiC layer 2 according to the CVD method. The film 8 serves as a gate insulation film of a MOS transistor. This gate insulation film may be formed according to the thermal oxidation method, or other methods.

In FIG. 3A, openings are formed on the CVD $SiO_2$ film 7 (21) and on the CVD $SiO_2$ film 3 formed on the polysilicon film 4. An aluminum (Al) film is coated over the substrate according to a sputtering method, etc., and patterned into a gate electrode 10, a source electrode (the second electrode) 11, and a drain electrode (i.e., the outputting electrode for the first electrode) 12. This completes a MOS transistor.

In FIG. 3B, instead of the gate insulation film 8 formed in the process of FIG. 8E, impurities are diffused into the side wall of the SiC semiconductor layer 2 to change the periphery of the SiC semiconductor layer 2 into a p-type region 9, to thereby form a p-n junction. Here, after the formation of the Al electrodes 10, 11, and 12, the exposed end walls of the SiC semiconductor layer 2 are heat-treated for, for example, 60 minutes at 400 to 500 degrees Centigrade so that Al diffuses into the SiC layer 2 to form the p-type regions 9, and thus the corresponding p-n junctions. SiC forms a good p-n junction due to the diffusion of Al.

In this way, an SIT is produced.

The SOI structure formed though the above processes can solve the problem (1) mentioned before of the conventional semiconductor device.

Since the invention does not use a field insulation film formed by a partial oxidation (LOCUS) method, the invention is free from the problem (2) of the conventional semiconductor device.

The electrode buried in the support substrate may be made of any material, including superconducting materials and metals, which can withstand the involved processing temperatures, so that the invention solves the problem (3) of the conventional semiconductor device.

In the above embodiments, a combination of the temporary substrate and semiconductor layer is made of Si and SiC. This may be Si/C (for example, diamond), Si/GaAs, Si/InP, Si/BN, Si/InSb, etc.

Although the embodiment is not a self-aligned-type element, the invention is also applicable for the self-aligned-type element such as disclosed in Japanese Unexamined Patent Publication No. 62-309438.

In the embodiment as shown in FIG. 8A to FIG. 8E, for example, the first electrode 4 is made of polycrystalline silicon, the second electrode 11 of Al, and the semiconductor layer 2 of SiC. The invention is not limited to these materials, but may be achieved with a proper combination of respective, such materials within applicable ranges for each thereof. The invention may employ superconducting materials. For example, the second electrode 11 serving as a source electrode and the polysilicon film 4 as a drain electrode may be made of superconducting materials to form a superconducting transistor.

More precisely, in FIG. 3A, the first and second electrodes 4 and 11 are made of superconducting materials, and a voltage applied from the gate electrode 10 to the semiconductor layer 2 controls a wave function between the first and second superconducting electrodes, thereby constituting a superconducting transistor.

According to the invention, various different types of transistors may be formed by changing the arrangement of the semiconductor layer 2. Namely, any one of MOSFET, $SiO_2$ FET, junction FET, and bipolar transistors may be formed.

Figure 4:
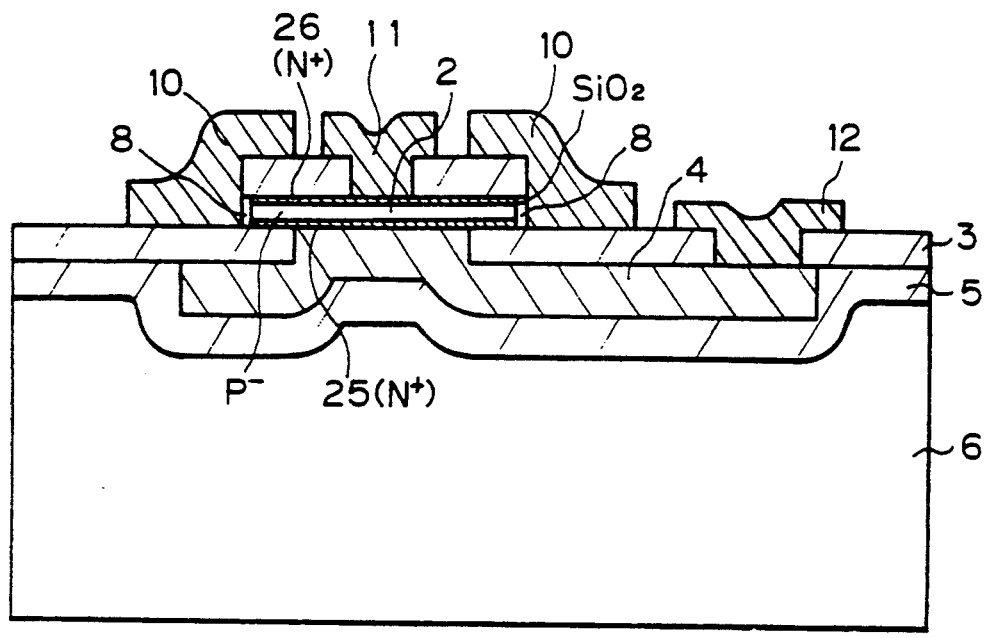
FIGS. 4 to 7 are respective, sectional views of different types of semiconductor devices which are formed according to the first and second embodiments of the invention.

For example, in FIG. 4, the semiconductor layer 2 contains p-type impurities in advance, and n+ impurities are diffused into upper and lower portions 25 and 26 of the semiconductor layer 2, thereby forming a MOSFET. In this case, the lower n+ diffusion layer 25 of the semiconductor layer 2 may be formed in the process of FIG. 8A by injecting and diffusing the impurities, and the upper n+ diffusion layer 26 may be formed in the process of FIG. 8C by injecting and diffusing the impurities. It is possible to use the respectively opposite n-type and p-type impurities. The n+ diffusion layers are preferably formed in contact with the $SiO_2$ insulation film 8 formed on each end wall of the semiconductor layer 2.

Figure 5:
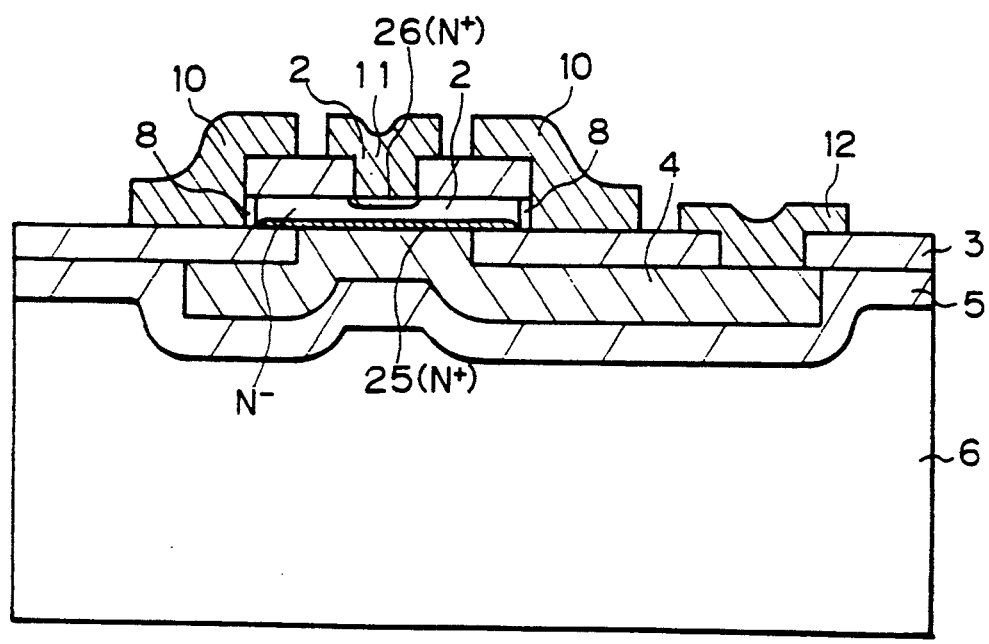

FIG. 5 shows an $SiO_2$ FET formed in the semiconductor layer 2 according to the invention. In this example, the semiconductor layer 2 has n− conductivity. A lower region 25 of the semiconductor layer 2 is made by diffusing n+ impurities, and an upper region 26 according to the opening 22 is made by diffusing n+ impurities. The lower diffusion region 25 is made in the process of FIG. 8A by diffusing the n-type impurities, while the upper diffusion region 26 is made after the process of FIG. 8E by diffusing the n-type impurities though the opening 22. In this example also, p-type semiconductor layer 2 may be used, instead of the illustrated n-type semiconductor layer 2.

Figure 6:
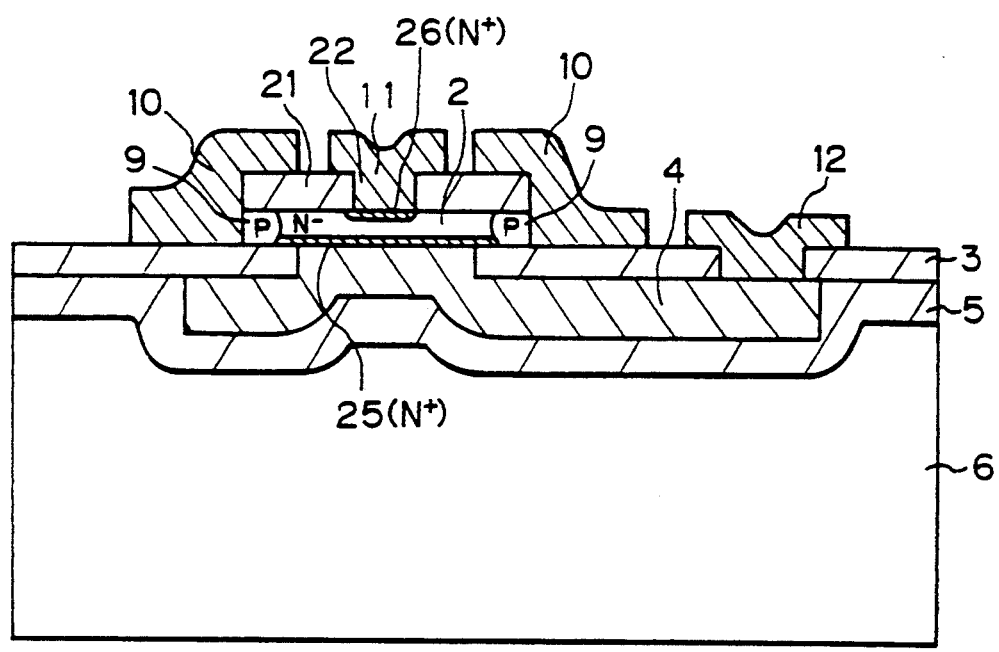

FIG. 6 shows a junction FET formed in the semiconductor layer 2 according to the invention. In the figure, the semiconductor layer 2 is of n− semiconductor, each end wall of which has a p-type diffusion layer 9. An n+ diffusion region 25 is formed in the lower portion of the semiconductor layer 2, and an n+ diffusion layer 26 is formed in the center section of the upper portion of the semiconductor layer 2. These regions 25 and 26 are formed in substantially the same manner as in the example of FIG. 5. The conductivity types of FIG. 6 are reversible.

Figure 7:
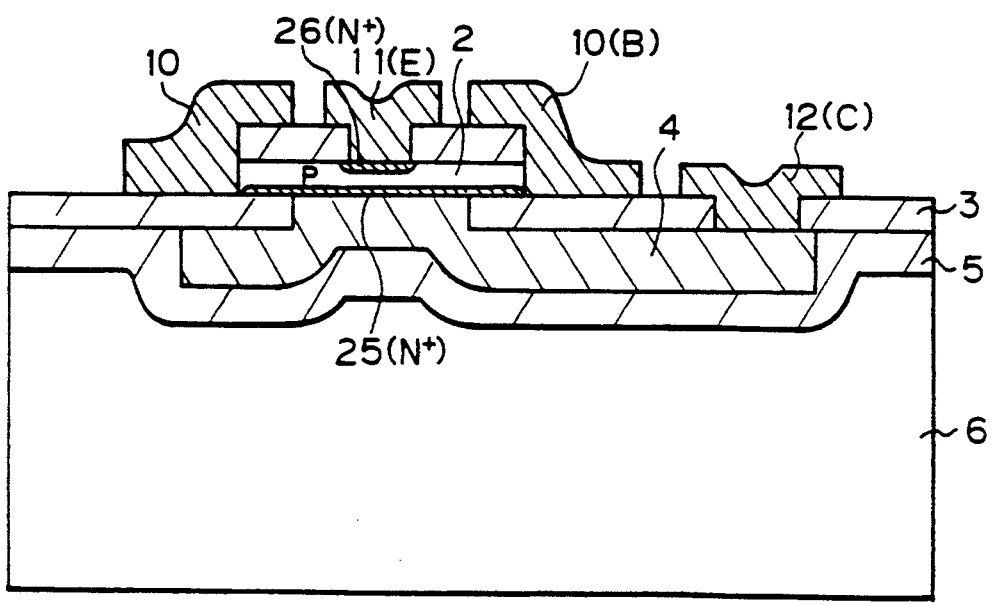

FIG. 7 shows a bipolar transistor formed in the semiconductor layer 2 according to the invention. In this case, the semiconductor layer 2 is of, for example, a p-type semiconductor. An n+ diffusion region 25 is formed in the lower portion of the semiconductor layer 2, and an n+ diffusion region 26 is formed in the center section of the upper portion of the semiconductor layer 2. The electrode 11 serves as an emitter (E), the electrode 10 as a base (B), and the electrode 12 as a collector (C). The diffusion regions 25 and 26 are formed in the same manner as in FIGS. 5 and 6. The conductivity types of FIG. 7 likewise are reversible.

According to the invention, the p-type impurities may be Al, B, etc., and the n-type impurities As, P, Sb, N, etc.

Figure 10:
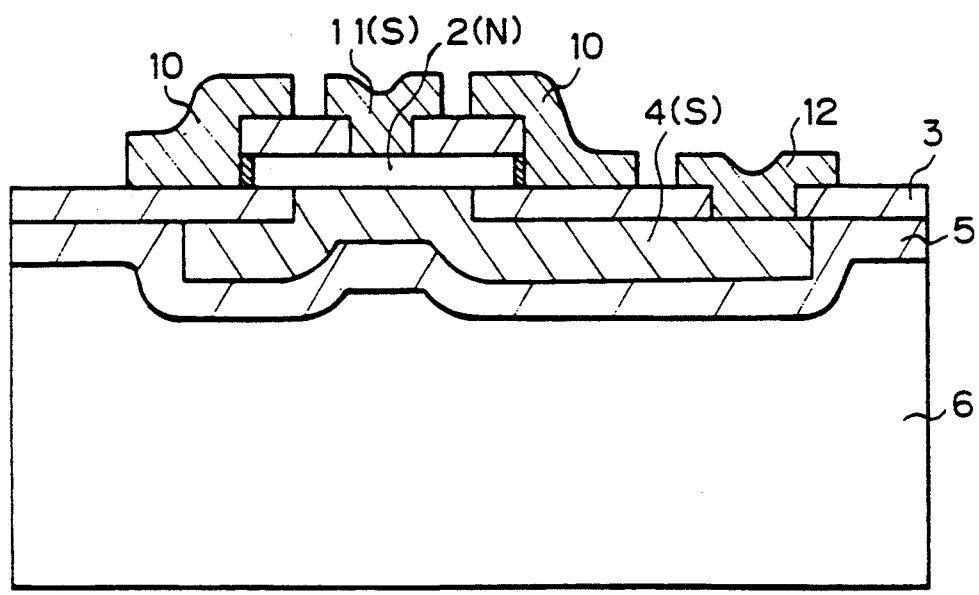
FIG. 10 is a sectional view of another embodiment of a semiconductor device according to the invention.

FIG. 10 shows a 3-terminal element incorporating a superconducting transistor according to the invention. A first electrode 4 is made of a superconducting material, a second electrode 11 is also made of a superconducting material, and the semiconductor layer 2 is of a normal semiconductor material. Namely, the monocrystalline semiconductor layer 2 is held, or sandwiched, between the superconducting materials 11(S) and 4(S). The conductivity type of the semiconductor layer 2 is optional. Each end of the semiconductor layer 2 is preferably covered with an insulation film. In this superconducting transistor, the phase of an electron wave function can be shifted by changing a voltage applied to a gate electrode 10 that is in contact with the semiconductor layer 2, to thereby control the current level in the layer 2. If the semiconductor layer 2 is thinned, the wave function of the current flow therethrough is more readily influenced by the gate voltage.

Another method of producing such a semiconductor device according to the invention having the first electrode made of a metal having a high melting point, high-temperature superconducting oxides, ceramics, a eutectic alloy of metal and semiconductor or silicides, instead of the polycrystalline silicon, will be explained hereunder.

First, a method of producing a semiconductor device having the first electrode made of a silicide, for example $W_2Si_3$, a metal having a high melting point, for example tungsten W or a composite material comprising polycrystalline silicon and silicide such as $W_2Si_3$, will be explained with reference to FIGS. 11A to 11G.

Figure 11A:
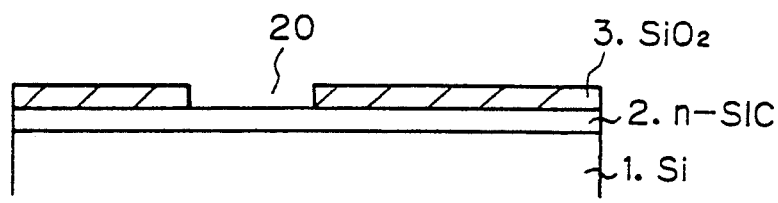
FIGS. 11A to 11G are views of respective structures produced in successive steps of another embodiment of a method of producing a semiconductor device according to the invention.

In FIG. 11A, a temporary Si substrate 1 is used to epitaxially grow thereon an n-type silicon carbide (n-SiC) semiconductor layer 2 of from 100 to 1000 Angstroms in thickness. The conditions for an epitaxial growth thereof are substantially the same as shown in the previous embodiment illustrated in FIGS. 8A to 8E.

An $SiO_2$ film 3 of from 2000 to 3000 Angstroms in thickness is grown as the second insulation film 3 on the semiconductor layer 2 by a vapor deposition (CVD) method, and a contact region 20 is opened by a normal lithography technique.

Figure 11B:
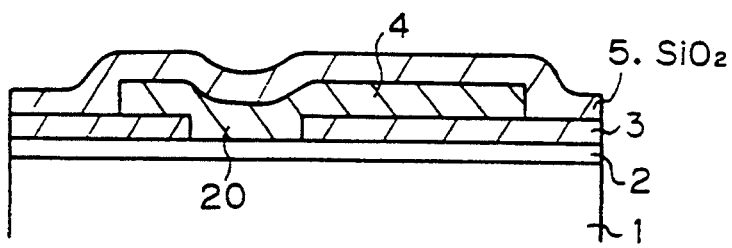

In FIG. 11B, a film 41 made of the silicide ($W_2Si_3$), a metal having a high melting point such as tungsten W, or a composite material comprising polycrystalline silicon and silicide such as $W_2Si_3$, is formed to a thickness of about 3000 Angstroms.

When the composite material comprising polycrystalline silicon and silicide such as $W_2Si_3$ is used, polycrystalline silicon doped with phosphorus is preferably used to thereby prevent contamination of the semiconductor device, made in accordance wit the present invention, with metal.

Next, the film 41 thus formed is patterned to form the first electrode 4.

Then, an $SiO_2$ film 5 about 3000 Angstroms in thickness is formed over the temporary substrate 1 by the CVD method.

This insulation film 5 is defined as the first insulator 5 according to the invention.

Figure 11C:
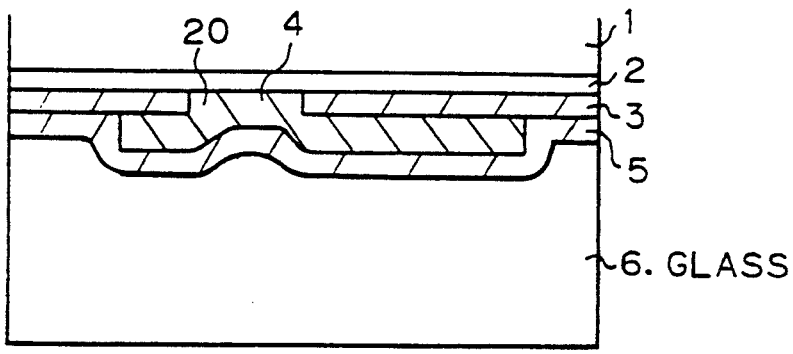

In FIG. 11C a glass plate having a melting point of about 600 to 1000 degrees Centigrade is used as a reinforcing material 6, and is melted and adhered to the surface of the $SiO_2$ film 5 made by the CVD method.

When forming the reinforcing material 6, the method of forming the same as shown in FIGS. 8A to 8E is applicable to this embodiment.

The temporary Si substrate 1 is etched with fluoronitrate and thus removed, thereby to expose the semiconductor layer 2. In this case, if the semiconductor layer 2 is made of SiC, it is substantially not etched.

Thereafter, the semiconductor device as a whole is turned upside down, as shown in FIG. 11C, and the reinforcing material 6 is used as a support substrate.

Figure 11D:
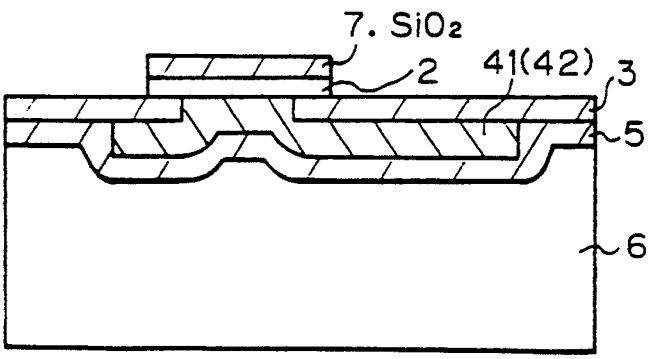

In FIG. 11D, an $SiO_2$ film 7 of about 2000 Angstroms in thickness is formed as the second insulation film 7 (21) on the surface of the support substrate, by a low-temperature plasma CVD method at 400 degrees Centigrade.

The $SiO_2$ film 7 and SiC layer 2 are etched, using a resist mask (not shown) formed on a contact region and an anisotropic etching, to form a protruding pattern.

Each end wall of the semiconductor layer 2 is exposed for accommodating the formation, relatively thereto, of a gate electrode.

Figure 11E:
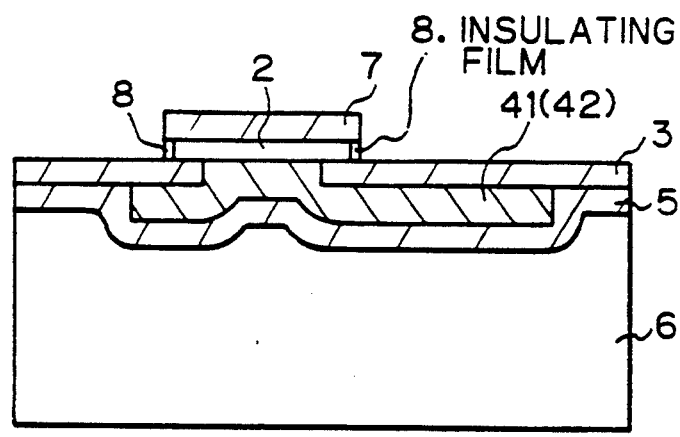

In this embodiment of the present invention, when a gate electrode is to be formed, first, an insulating film is formed; as shown in FIG. 11E, an $SiO_2$ film 8 of 300 Angstroms in thickness is formed on each end wall of the SiC layer 2 by the CVD method.

The process of forming the insulating gate film 8 is such that the semiconductor layer made of SiC is subjected to a thermal treatment at a temperature of 1000° C. for 30 minutes in a wet atmosphere, whereby the oxide film having a thickness of 300 Angstroms is formed on the end walls of the SiC semiconductor layer 2; alternatively, after forming a $SiO_2$ film about 300 Angstroms in thickness on the entire surface of the semiconductor device by the CVD method, the $SiO_2$ film is removed while selectively leaving necessary portions thereof on the required surfaces.

Figure 11F:
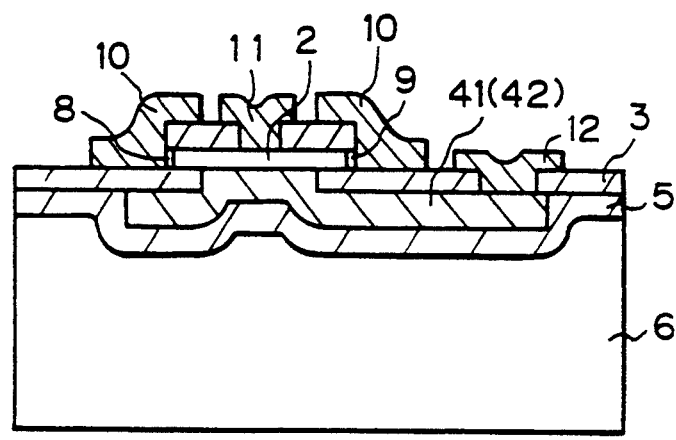

In FIG. 11F, openings are formed in the CVD $SiO_2$ film 7 and in the CVD $SiO_2$ film 3 formed on the film 41, the latter to become the first electrode.

An aluminum (Al) film is coated over the substrate by a sputtering method, etc., and patterned to form a gate electrode 10, a source electrode (the second electrode) 11, and a drain electrode (the output electrode for the first electrode) 12. Note, in this embodiment, these electrodes can be made of any kind of metal having a sufficient conductivity.

On the other hand, when the gate of the semiconductor device of this embodiment is formed by a P-N junction instead of the insulating film, in the process shown in FIG. 11D, an aluminum (Al) film is first formed on the entire surface of the semiconductor device, and then the film is subjected to a thermal treatment at 500° C. for about 60 minutes.

Then, after the structure is subjected to a treatment with HCl to thereby remove the film therefrom, it is further subjected to an annealing treatment at about 900° C. for about 30 minutes.

Accordingly, a P-type diffusion region, obtained by a diffusion of aluminum (Al) into the SiC layer, is formed at both end portions of the SiC semiconductor layer 2, which are exposed to the air, and thus a good pn junction is formed therein.

Figure 11G:
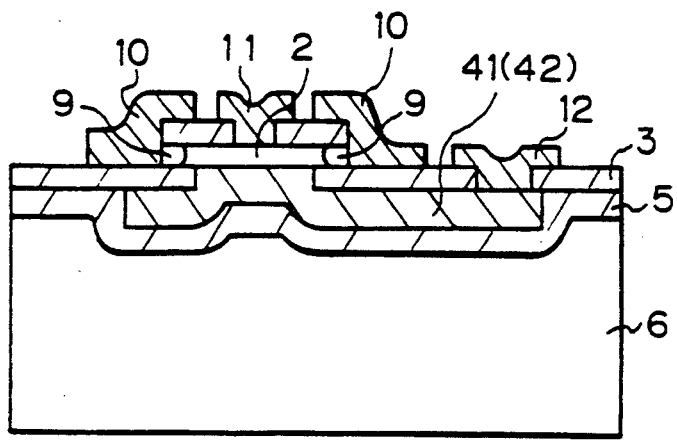

The same treatment for forming electrodes as shown in the previous embodiment is then carried out, and a semiconductor device as shown in FIG. 11G obtained.

Next, another method of producing a semiconductor device according to the invention having the first electrode made of a selected one of high-temperature superconducting oxides, for example, $YBa_2Cu_3O_{7-x}$ or $Bi_2Sr_2CaCu_2O_y$, will be explained with reference to FIGS. 12A to 12C.

Figure 12A:
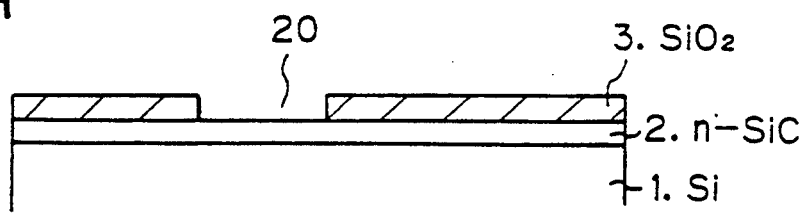
FIGS. 12A–12C are views of successive structures produced in successive steps of a further embodiment of a method of producing a semiconductor device according to the invention.

The process as shown in FIG. 12A is carried out in the same way as shown in FIG. 11A.

Figure 12B:
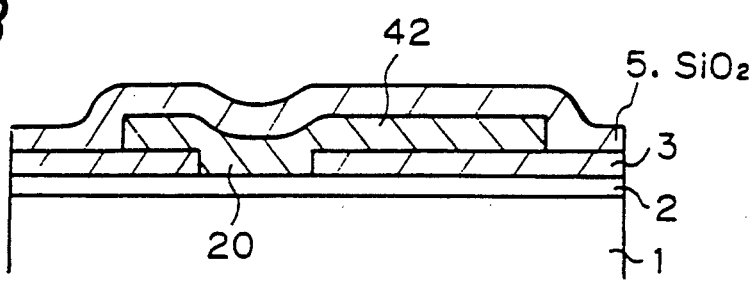
Figure 12C:
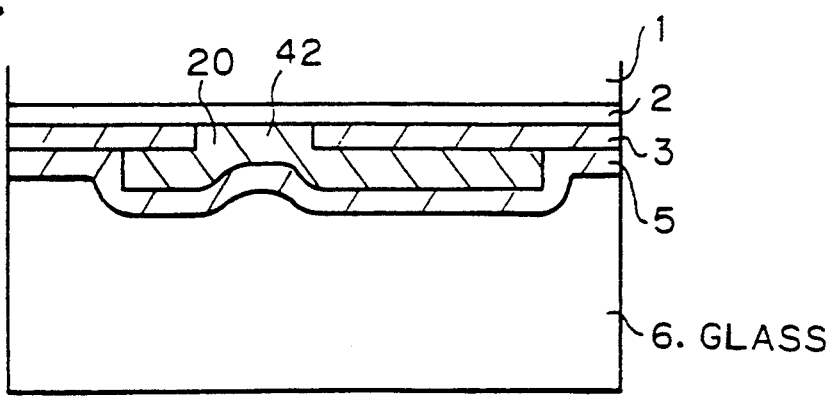

In the process shown in FIG. 12B, a first electrode is formed of a film 42 made of a selected one of high-temperature superconducting oxides, for example, $YBa_2Cu_3O_{7-x}$ or $Bi_2Sr_2CaCu_2O_y$, instead of a film 41 made of the silicide ($W_2Si_3$), a metal having a high melting point such as tungsten W or a composite material comprising polycrystalline silicon and silicide such as $W_2Si_3$, as shown in FIG. 11B. FIG. 12(c) shows that the same process as indicated in FIG. 8C or FIG. 11C, is carried out.

A sputtering method or MBE method can be used for forming the film 42 of this embodiment.

Thereafter, the same processes as shown in FIGS. 11C to 11G can be applied to this embodiment, but preferably an etching method utilizing an $Ar^+$ ion beam is used in this embodiment.

In this embodiment, the electrodes 10, 11 and 12, as shown in FIGS. 11F and 11G, are preferably made of a selected one of high-temperature superconducting oxides.

As explained above, the high-speed vertical semiconductor device and the method of producing the same according to the invention provide the following benefits:

(1) forming an SOI structure suitable for a high-speed operation;

(2) eliminating a field insulation film, and thereby eliminating an abnormality frequently occurring, due to the field of insulation film, at a gate opening portion adjacent to a semiconductor layer in conventional high-speed vertical structures;

(3) allowing the source and drain electrodes of a semiconductor device to be formed with superconducting materials, thereby improving the speed of the semiconductor device; and (4) precisely and efficiently producing semiconductor devices employing a self-alignment technique without using a LOCOS technique.

I claim:

1. A semiconductor device comprising:
   a substrate having a main surface;
   a first electrode having first and second main surfaces and sidewall surfaces transverse to and extending between the first and second main surfaces, the first electrode being recessed within the substrate with the sidewall surfaces and the second main surface thereof disposed within the substrate and the first main surface thereof exposed at the substrate main surface, a first portion of the first main surface thereof being disposed at, and a second portion of the first main surface thereof projecting from, the substrate main surface;

a field oxide film covering the exposed, first portion of the first main surface of the first electrode and having a first opening therein through which the projecting, second portion of the first main surface of the first electrode extends and is exposed, and further having a second opening therein displaced from the first opening and through which second opening a corresponding part of the first portion of the first main surface of the first electrode is exposed;

a semiconductor layer disposed on the field oxide film and extending over the first opening in the field oxide film and contacting and thereby being connected with the exposed and projecting, second portion of the first main surface of the first electrode, the semiconductor layer being displaced from the second opening in the field oxide film and having a first main surface and end wall surfaces which are exposed;

an insulator layer disposed on and covering the exposed, first main surface of the semiconductor layer and having an exposed first main surface and exposed end walls and further having an opening therein through which a corresponding surface portion of the first main surface of the semiconductor layer is exposed, at least one end wall of the insulator layer and a corresponding end wall surface of the semiconductor layer being substantially transverse to the substrate main surface and being substantially, mutually aligned;

a second electrode formed on and extending from the exposed, first main surface of the insulator layer and through the opening in the insulator layer and contacting and thereby being connected with the corresponding, exposed surface portion of the first main surface of the semiconductor layer;

a control electrode having corresponding portions respectively formed on the insulator layer and the field oxide film and electrically coupled to the at least one end wall surface of the semiconductor layer, the control electrode being spaced form the first electrode; and an output electrode, spaced from the control electrode, extending from a surface of and through the second opening in the field oxide film and contacting and thereby being connected to the corresponding, exposed part of the first portion of the first main surface of the first electrode.

2. A semiconductor device as recited in claim 1, further comprising a further insulator layer disposed between the first electrode and the substrate and thereby electrically isolating the first electrode from the substrate.

3. A semiconductor device as recited in claim 1 wherein the control electrode comprising a gate electrode, further comprising a gate insulation film formed on the at least one end wall surface of the semiconductor layer and electrically insulating the gate electrode from the semiconductor layer, the gate electrode thereby being electrically coupled through the gate insulation film to the semiconductor layer.

4. A semiconductor device as recited in claim 1, further comprising a diffusion region formed in the at least one end wall surface of the semiconductor layer and having a conduction type different from that of the conduction type of the semiconductor layer, the control electrode thereby being electrically coupled through the diffusion layer to the semiconductor layer.

5. A semiconductor device as set forth in claim 1, wherein a material of the substrate is a selected one of semiconductor, insulation, and glass materials.

6. A semiconductor device as set forth in claim 1, wherein a material of the first electrode is polycrystalline silicon, and the material of the semiconductor layer is monocrystalline silicon.

7. A semiconductor device as set forth in claim 1, wherein the semiconductor device comprises a selected one of MOSFET, $SiO_2$ FET, junction FET, and bipolar transistor semiconductor devices.

8. A semiconductor device as set forth claim 1, wherein a material of the first electrode is selected one of metal, a eutectic alloy of metal and semiconductor, ceramic, superconducting, and semiconductor materials.

9. A semiconductor device as set forth in claim 1, wherein a material of the semiconductor layer is a monocrystalline material.

10. A semiconductor device as set forth in claim 8, wherein the material of the first electrode is of low resistance.

11. A semiconductor device as set forth in claim 8, wherein a material of the semiconductor layer is polycrystalline silicon.

12. A semiconductor device as set forth in claim 8, wherein a material of each of the first and second electrodes is a superconducting material, and a voltage applied to the semiconductor layer controls an electron wave function between the first and second superconducting electrodes.

13. A semiconductor device as set forth in claim 9, wherein the monocrystalline material is a selected one of monocrystalline silicon, diamond thin film, and boron nitride materials.

14. A semiconductor device as set forth in claim 13, wherein the monocrystalline silicon material is silicon carbide (SiC).

15. A semiconductor device comprising:

a substrate having a main surface;

a first electrode buried in the substrate and correspondingly having buried, lower and side surface portions and further having an exposed upper surface at the main surface of the substrate;

a first insulator disposed in surrounding relationship with respect to the first electrode and between the buried, lower and side surface portions thereof and the substrate;

a field oxide film covering the exposed upper surface of the first electrode and having a first opening therein through which a first portion of the exposed upper surface of the first electrode is exposed;

a semiconductor layer formed on the field oxide film and connected with the first portion of the exposed upper surface of the first electrode through the first opening in the field oxide film, the semiconductor layer having an exposed upper surface and further having exposed end wall surfaces which are transverse to the main surface of the substrate;

a second insulator covering the exposed upper surface of the semiconductor layer and having an opening therein exposing therethrough a portion of the exposed upper surface of the semiconductor layer;

a second electrode formed on the second insulator and extending through the opening therein and in contact with the exposed upper surface of the semiconductor layer;

a control electrode formed on the field oxide film and electrically coupled to the exposed end wall surface of the semiconductor layer;

the field oxide film having a second opening therein, displaced from both the first opening therein and the control electrode, exposing therethrough a second portion of the exposed upper surface of the first electrode; and an output electrode formed on the field oxide film and extending through the second opening therein and electrically contacting the second portion of the exposed upper surface of the first electrode.

16. A semiconductor device as recited in claim 15, wherein the substrate is of a material selected from the class consisting of semiconductor, insulation, and glass materials.

17. A semiconductor device as recited in claim 15, further comprising:

a gate insulation film formed over each of the exposed end walls of the semiconductor layer, the gate electrode being coupled to the end walls of the semiconductor layer through the insulation film.

18. A semiconductor device as recited in claim 15, wherein:

the semiconductor layer is doped with an impurity of a first conductivity type; and the exposed end wall surface of the semiconductor layer are doped with impurities of a second conductivity type, different from the first conductivity type, thereby forming corresponding diffusion regions, the control electrode being coupled to the end wall surface of the semiconductor layer through the corresponding diffusion regions.

19. A semiconductor device as recited in claim 15, wherein the device comprises a MOSFET.

20. A semiconductor device as recited in claim 15, wherein the device comprises an $SiO_2$ FET.

21. A semiconductor device as recited in claim 15, wherein the device comprises a junction FET.

22. A semiconductor device as recited in claim 15, wherein the device comprises a bipolar type transistor.

23. A semiconductor device as recited in claim 15, wherein the semiconductor layer comprises a monocrystalline material.

24. A semiconductor device as recited in claim 15, wherein the first electrode is of a material selected from the class consisting of metal, eutectic alloy of metal and semiconductor, ceramic, superconducting, and semiconductor materials.

25. A semiconductor device as recited in claim 23, wherein the monocrystalline material is selected from the class consisting of monocrystalline silicon, diamond thin film, and boron nitride materials.

26. A semiconductor device as recited in claim 23, wherein the monocrystalline material comprises silicon carbide.

27. A semiconductor device as recited in claim 24, wherein the semiconductor material is polycrystalline silicon.

28. A semiconductor device as recited in claim 24, wherein:

each of the first and second electrodes comprises a superconducting material; and the semiconductor layer supports a current flow therethrough, between the first and second superconducting material electrodes, having a wave function controlled by a voltage applied to the control electrode and coupled therefrom to the semiconductor layer.

29. A semiconductor device as recited in claim 24, wherein the selected material of the first electrode is of a low electrical resistance.

30. A semiconductor device as recited in claim 29, wherein the first electrode is a polycrystalline silicon material and the semiconductor layer is a monocrystalline silicon material.

* * * * *